United States Patent [19]

Shimoda et al.

[11] Patent Number: 5,194,421
[45] Date of Patent: Mar. 16, 1993

[54] BI-PB-SR-MG-BA-CA-CU-O OXIDE SUPERCONDUCTORS AND PRODUCTION THEREOF

[75] Inventors: Shuichiro Shimoda; Toranosuke Ashizawa; Keiji Sumiya; Hideji Kuwajima; Minoru Ishihara, all of Katsuta; Shozo Yamana, Hitachi, all of Japan

[73] Assignee: Hitachi Chemical Company, Tokyo, Japan

[21] Appl. No.: 794,694

[22] Filed: Nov. 20, 1991

Related U.S. Application Data

[63] Continuation of Ser. No. 556,448, Jul. 24, 1990, abandoned.

[30] Foreign Application Priority Data

Mar. 26, 1990 [JP] Japan ................... 2-76141

[51] Int. Cl.$^5$ .................. C01F 11/02; C01G 3/02; C01G 29/00; H01L 39/02
[52] U.S. Cl. ........................... 505/1; 252/518; 252/521; 505/776; 505/782
[58] Field of Search .............. 505/1, 776, 782; 252/521, 518; 501/123; 423/604, 617, 618, 635

[56] References Cited

FOREIGN PATENT DOCUMENTS

| | | | |
|---|---|---|---|
| 0348986 | 1/1990 | European Pat. Off. ............ | 505/782 |
| 0215720 | 8/1989 | Japan ................... | 505/782 |
| 0308803 | 12/1989 | Japan ................... | 505/782 |
| 2038357 | 2/1990 | Japan . | |

OTHER PUBLICATIONS

Dou "Superconductivity in the Bi-Pb-Sr-Ca-Cu-O system . . ." *Supercond. Sc. Technol.* vol. 2 1989 pp. 274–278.
Kawai "Effect of Ba addition on the properties . . .". *Jap. Jnl Appl. Phys.* vol. 27(12) Dec. 1988 pp. L2296–L2299.
Zuyao "Superconductivity in the (Bi,Pb)-Ca-Sr-Ba-Cu-O . . ." *Solid State Comm.* vol. 70(2) 1989 pp. 133–135.
"Ashizawa Variation of Composition in a Bi(Pb)-Sr-Ca-Cu-O . . ." *Jap. Jnl. Appl. Physic.* vol. 28(7) Jul. 1989 pp. L1140–L1143.

*Primary Examiner*—Paul Lieberman
*Assistant Examiner*—John Boyd
*Attorney, Agent, or Firm*—Antonelli, Terry, Stout & Kraus

[57] ABSTRACT

The present invention provides an oxide superconductor which is mainly composed of bismuth, lead, strontium, calcium, magnesium, and copper and has the composition represented by the formula:

$$Bi_{1-A}Pb_ASr_{1-B}Mg_BCa_1Cu_{1.7\pm0.3}O_x$$

wherein A=0.15–0.35 and B=0.05–0.3 in which numerals represent atomic ratio and an oxide superconductor which is mainly composed of bismuth, lead, strontium, calcium, magnesium, barium and copper and has the composition represented by the formula:

$$Bi_{1-A}Pb_ASr_{1-(B+C)}(Mg_BBa_C)Ca_1Cu_{1.7\pm0.3}O_x$$

wherein A=0.15–0.35, B=0.05–0.3 and C=0.02–0.2 in which numerals represent atomic ratio. Methods for producing these superconductors are also provided.

4 Claims, 2 Drawing Sheets

BI-PB-SR-MG-BA-CA-CU-O OXIDE SUPERCONDUCTORS AND PRODUCTION THEREOF

This application is a continuation of application Ser. No. 556,448, filed on Jul. 24, 1990 now abandoned.

BACKGROUND OF THE INVENTION

The present invention relates to oxide superconductors and process for production thereof.

As conventional oxide superconductors, generally known are Bi—Sr—Ca—Cu—O superconductors mainly composed of bismuth, strontium, calcium and copper which was found by Maeda, general research worker, and others of National Research Institute for Metals on Jan. 20, 1988, and Bi—Sr—Ca—Mg—Cu—O oxide superconductors mainly composed of bismuth, strontium, calcium, magnesium and copper, Bi—Pb—Sr—Ca—Cu—O oxide superconductors mainly composed of bismuth, lead, strontium, calcium and copper, and Bi—Pb—Sr—Ca—Ba—Cu—O oxide superconductors mainly composed of bismuth, lead, strontium, calcium, barium and copper which are obtained by substitution of elements of the above-mentioned Bi—Sr—Ca—Cu—O oxide superconductors.

However, the above Bi—Sr—Ca—Cu—O oxide superconductors suffer from the problems in that high temperature phase where critical temperature at which electrical resistance becomes zero (hereinafter referred to as "$T_C^{ZERO}$") is about 110 K is formed with difficulty and intermediate temperature phase of $T_C^{ZERO}$ being about 80 K and heterogeneous phases differing in crystal or composition are apt to be formed. Bi—Sr—Ca—Mg—Cu—O oxide superconductors comprising Bi—Sr—Ca—Cu—O to which Mg is added have a defect in that $T_C^{ZERO}$ decreases with addition of Mg as shown, for example, in "Japanese Journal of Applied Physics", Vol. 27, No. 12 (December, 1988), pages L2330-L2332.

In case of Bi—Pb—Sr—Ca—Cu—O oxide superconductors which comprise Bi—Sr—Ca—Cu—O to which Pb is added, high temperature phase is easily formed, but they have defects in that range of firing temperature for forming the high temperature phase is narrow and intermediate temperature phase tends to remain. In case of Bi—Pb—Sr—Ca—Ba—Cu—O oxide superconductors which comprise Bi—Pb—Sr—Ca—Cu—O to which Ba is added, $T_C^{ZERO}$ rises with addition of Ba, but there is a defect in that heterogeneous phases such as $BaCuO_2$ and $BaBiO_3$ which are different from the desired high temperature phase are produced.

SUMMARY OF THE INVENTION

The object of the present invention is to provide an oxide superconductor in which high temperature phase can be readily formed and substantially no heterogeneous phases are formed and which has a high critical current density (Jc), and a process for producing it.

The present invention provides an oxide superconductor which comprises, as main components, bismuth, lead, strontium, calcium, magnesium and copper and has the composition represented by the formula (I):

wherein A=0.15-0.35 and B=0.05-0.3, where numerals represent atomic ratio.

The present invention further provides a process for producing an oxide superconductor which comprises weighing starting materials containing bismuth, lead, strontium, calcium, magnesium and copper, respectively so as to obtain the composition shown by the above formula (I), primarily mixing the starting materials containing bismuth, strontium, calcium, magnesium and copper, calcining and grinding the mixture, adding a starting material containing lead to the ground product, secondarily mixing them, and firing the mixture.

The present invention further provides an oxide superconductor which comprises, as main components, bismuth, lead, strontium, calcium, magnesium, barium and copper and which has the composition represented by the formula (II):

wherein A=0.15-0.35, B=0.05-0.3, and C=0.02-0.2, where the numerals represent atomic ratio.

The present invention additionally provides a process for producing an oxide superconductor which comprises weighing starting materials containing bismuth, lead, strontium, calcium, magnesium, barium and copper, respectively so as to obtain the composition represented by the above formula (II), then primarity mixing the starting materials containing bismuth, strontium, calcium, magnesium, barium and copper, respectively, calcining and grinding the mixture, adding a starting material containing lead to the ground product, secondarily mixing them and firing the mixture.

DESCRIPTION OF THE PREFERRED EMBODIMENTS

Figure 1:
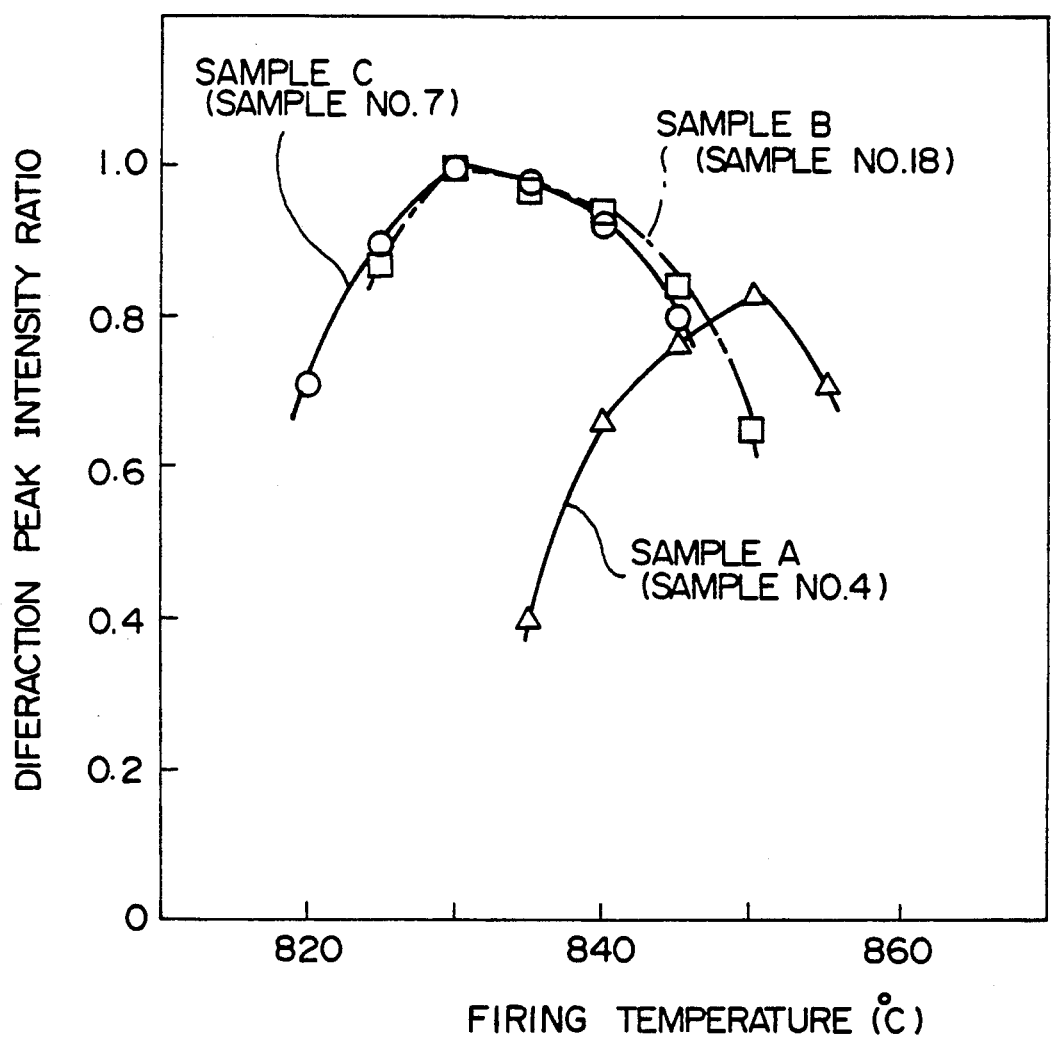
FIG. 1 is a graph which shows relation between diffraction peak intensity ratio and firing temperature and FIG. 2 shows relation between superconductor content at 77 K and firing temperature.

There are no limitations in starting materials containing bismuth, lead, strontium, calcium, magnesium, and copper which are main components constituting the oxide superconductor of the present invention and starting material containing barium and, for example, at least one of oxide, carbonate, nitrate, and oxalate is used.

In the formula:

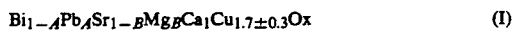

subscript A is atomic ratio and is within the range of 0.15-0.35. When the atomic ratio is less than 0.15, intermediate temperature phase is readily formed to result in reduction of amount of high temperature phase formed and when it is more than 0.35, heterogeneous phase such as oxide of lead and calcium ($Ca_2PbO_4$) is formed in a large amount and critical temperature decreases.

Subscript B is atomic ratio and is within the range of 0.05-0.3. When the atomic ratio is less than 0.05, range of firing condition for formation of high temperature phase is narrow and besides, it is difficult to make electrical resistance stably zero at about 110 K and when it is more than 0.3, heterogeneous phase such as crystals other than superconductor and glass tend to be formed and $T_C^{ZERO}$ decreases.

In the formula:

the atomic ratios of A and B are the same as above and subscript C is atomic ratio and within the range of 0.02–0.2. When the atomic ratio of C is less than 0.02, conspicuous effect cannot be obtained and when it is more than 0.2, heterogeneous phases such as $BaCuO_2$ and $BaBiO_3$ are readily formed.

Mixing method has no special limitation and preferred is one which comprises charging balls coated with synthetic resin, a solvent such as ethanol, methanol or the like and the starting materials in a ball mill made of synthetic resin and carrying out wet mixing.

After other starting materials than the starting material containing lead have been primarily mixed, calcined and ground, the starting material containing lead is added to the ground product and secondarily mixed. If the starting material containing lead is primarily mixed together with other starting materials and then the mixture is calcined, a part of lead is evaporated to result in deviation in composition and oxide superconductor of high temperature phase cannot be obtained.

Regarding the calcination conditions, calcination temperature is optionally chosen depending on mixing ratio of the starting materials and preferably is 780°–830° C. Calcination atmosphere is not critical and may be air atmosphere, oxygen atmosphere, vacuum atmosphere, reducing atmosphere, and the like.

Grinding is preferably carried out by rough grinding in an alumina mortar and then wet grinding to fine powders. Balls used for grinding have no special limitation, but preferred are those which have a large specific gravity and are excellent in wear resistance such as zirconia balls and super hard balls.

Regarding firing conditions, firing temperature can be optionally chosen depending on mixing ratio of the starting materials and preferably is 820°–870° C. and firing atmosphere is preferably air atmosphere, air stream, low oxygen pressure atmosphere (oxygen content: 1–20 vol %, preferably 2–10 vol %), or the like.

With reference to crystalline phase, the high temperature phase is one which has a crystalline phase which shows a $T_C^{ZERO}$ of about 110 K and the intermediate temperature phase is one which has a crystalline phase which shows a $T_C^{ZERO}$ of about 80 K.

In the composition of the present invention, amount of O (oxygen) determines depending on amount of Pb, amount of Cu and oxidation state of Cu. However, the oxidation state cannot severely and accurately be measured and so amount of O is expressed by x.

The present invention will be explained by the following examples.

EXAMPLE 1

Bismuth trioxide (purity: 99.9%, manufactured by Kojundo Kagaku Kenkyusho Co.), strontium carbonate (purity: 99.9%, manufactured by Rare Metallic Co.), magnesium oxide (purity: 99.9%, manufactured by Kojundo Kagaku Kenkyusho Co.), calcium carbonate (purity: 99.99%, manufactured by Kojundo Kagaku Kenkyusho Co.), and cupric oxide (purity: 99.9%, manufactured by Kojundo Kagaku Kenkyusho Co.) were weighed so as to obtain the atomic ratio of bismuth, strontium, magnesium, calcium, and copper as shown in the composition in Table 1. These were used as starting materials.

The starting materials were charged in a ball mill made of a synthetic resin together with steel balls covered with a synthetic resin and methanol and wet mixed and ground at 50 rpm for 60 hours. After drying, the resulting ground product was put on an aluminum fired plate and calcined at 800° C. for 12 hours in the air atmosphere using an electric furnace and roughly ground in a mortar. Then, the roughly ground product, zirconia balls, methanol, and lead monoxide (yellow) (special grade: manufactured by Wako Pure Chemical Industries, Ltd.) weighed so as to obtain the atomic rate as shown in the composition in Table 1 were charged in a ball mill of a synthetic resin and wet ground at 50 rpm for 24 hours and then, the ground product was dried to obtain a composition for oxide superconductor. This composition was press molded in a mold under a pressure of 147 MPa. Thereafter, Sample Nos. 1–3 were fired in the air for 80 hours at a firing temperature shown in Table 1 and Sample Nos. 4–20 were fired in a low oxygen pressure atmosphere of $O_2:N_2=1:10$ in volume ratio for 80 hours at a firing temperature shown in Table 1 to obtain oxide superconductors of 1 mm thick.

The resulting oxide superconductors were processed into rectangular parallelopipeds of 20 mm length × 3 mm width × 1 mm thickness. Change of electrical resistance with temperature was measured by four terminal method and $T_C^{ZERO}$ was obtained. The results are shown in Table 1.

Each of the oxide superconductors was ground in a mortar into powders and rate of change of inductance was measured and content of superconductor at 77 K was obtained. The results are shown in Table 1.

Separately, each of oxide superconductors of Sample Nos. 4, 5, 18 and 20 was again ground in a mortar and then press molded in a mold under a pressure of 196 MPa and subsequently, the resulting molded product was refired for 24 hours at firing temperature shown in Table 1 in the same low oxygen pressure atmosphere as used above to obtain again oxide superconductor. This was processed into a rectangular parallelopiped and critical current density (Jc) was measured at the temperature of liquid nitrogen (77.3 K) by four terminal method. The results are shown in Table 2.

TABLE 1

| Sample No. | Composition | $T_c^{zero}$ (K) | Crystalline phase identified from X-ray diffraction peak | Firing temperature (°C.) | Superconductor content at 77K (vol %) |
| --- | --- | --- | --- | --- | --- |
| *1 | $Bi_1Sr_1Ca_1Cu_{1.5}O_x$ | 72 | Intermediate temperature phase, $Ca_2CuO_3$, high temperature phase | 875 | 0 |
| *2 | $Bi_1S_{0.9}Mg_{0.1}Ca_1Cu_{1.5}O_x$ | 70 | Intermediate temperature phase, CuO | 875 | 0 |
| *3 | $Bi_1Sr_{0.7}Mg_{0.3}Ca_1Cu_2O_x$ | 62 | Intermediate temperature phase, CuO, unidentifiable peak | 875 | 0 |
| *4 | $Bi_{0.5}Pb_{0.2}Sr_1Ca_1Cu_{1.8}O_x$ | 106 | High temperature phase, intermediate temperature phase | 845 | 63 |
| *5 | $Bi_{0.7}Pb_{0.3}Sr_1Ca_1Cu_{1.4}O_x$ | 105 | High temperature phase, intermediate temperature phase, $Ca_2PbO_4$ | 845 | 62 |
| *6 | $Bi_{0.8}Pb_{0.2}Sr_1Ca_1Cu_2O_x$ | 106 | High temperature phase, intermediate temperature phase | 850 | 59 |

TABLE 1-continued

| Sample No. | Composition | $T_c^{zero}$ (K) | Crystalline phase identified from X-ray diffraction peak | Firing temperature (°C.) | Superconductor content at 77K (vol %) |
|---|---|---|---|---|---|
| *7 | $Bi_{0.7}Pb_{0.3}Sr_{0.7}Ba_{0.3}Ca_1Cu_{1.6}Ox$ | 103 | High temperature phase, $BaCuO_2$, $BaBiO_3$, unidentifiable peak | 825 | 57 |
| *8 | $Bi_{0.75}Pb_{0.25}Sr_{0.75}Ba_{0.25}Ca_1Cu_{1.8}Ox$ | 106 | High temperature phase, $BaCuO_2$, $BaBiO_3$ | 830 | 61 |
| 9 | $Bi_{0.85}Pb_{0.15}Sr_{0.9}Mg_{0.1}Ca_1Cu_{1.8}Ox$ | 108 | High temperature phase | 835 | 90 |
| 10 | $Bi_{0.8}Pb_{0.2}Sr_{0.55}Mg_{0.15}Ca_1Cu_2Ox$ | 109 | High temperature phase | 830 | 85 |
| 11 | $Bi_{0.8}Pb_{0.2}Sr_{0.7}Mg_{0.3}Ca_1Cu_2Ox$ | 108 | High temperature phase | 820 | 83 |
| *12 | $Bi_{0.8}Pb_{0.2}Sr_{0.65}Mg_{0.35}Ca_1Cu_2Ox$ | 84 | Intermediate temperature phase, high temperature phase, unidentifiable peak | 820 | 39 |
| *13 | $Bi_{0.8}Pb_{0.2}Sr_{0.97}Mg_{0.03}Ca_1Cu_2Ox$ | 106 | High temperature phase, intermediate temperature phase | 840 | 61 |
| 14 | $Bi_{0.7}Pb_{0.3}Sr_{0.9}Mg_{0.1}Ca_1Cu_{1.6}Ox$ | 109 | High temperature phase | 840 | 89 |
| 15 | $Bi_{0.7}Pb_{0.3}Sr_{0.75}Mg_{0.25}Ca_1Cu_{1.6}Ox$ | 110 | High temperature phase | 830 | 92 |
| *16 | $Bi_{0.9}Pb_{0.1}Sr_{0.9}Mg_{0.1}Ca_1Cu_{1.6}Ox$ | 88 | Intermediate temperature phase | 840 | 17 |
| *17 | $Bi_{0.6}Pb_{0.4}Sr_{0.9}Mg_{0.1}Ca_1Cu_{1.6}Ox$ | 63 | Intermediate temperature phase, $Ca_2PbO_4$, Unidentifiable peak, High temperature phase | 830 | 42 |
| 18 | $Bi_{0.8}Pb_{0.2}Sr_{0.8}Mg_{0.2}Ca_1Cu_{1.8}Ox$ | 110 | High temperature phase | 830 | 84 |
| 19 | $Bi_{0.75}Pb_{0.25}Sr_{0.8}Mg_{0.2}Ca_1Cu_{1.8}Ox$ | 109 | High temperature phase | 825 | 82 |
| 20 | $Bi_{0.7}Pb_{0.3}Sr_{0.8}Mg_{0.2}Ca_1Cu_{1.8}Ox$ | 110 | High temperature phase | 820 | 80 |

Mark * means samples which are not covered by the present invention. "Unidentifiable peak" shows that there exists indefinite crystalline phase.

TABLE 2

| | Sample No. | | | |
|---|---|---|---|---|
| | *4 | *5 | 18 | 20 |
| $Jc$ (A/cm$^2$) | 620 | 430 | 1810 | 1630 |

Mark * means samples which are not covered by the present invention.

The results shown in Tables 1 and 2 show that in the oxide superconductors in examples of the present invention, heterogeneous phases are not formed and they are higher in $T_c^{ZERO}$ and Jc than those of comparative examples and besides, in the superconductors of the present invention, much high temperature phase is formed and content of superconductor at 77 K is high.

EXAMPLE 2

Bismuth trioxide (purity: 99.9%, manufactured by Kojundo Kagaku Kenkyusho Co.), strontium carbonate (purity: 99.9%, manufactured by Rare Metallic Co.), magnesium oxide (purity: 99.9%, manufactured by Kojundo Kagaku Kenkyusho Co.), barium carbonate (purity: 99.9%, manufactured by Wako Pure Chemical Industries, Ltd.), calcium carbonate (purity: 99.99%, manufactured by Kojundo Kagaku Kenkyusho Co.), and cupric oxide (purity: 99.9%, manufactured by Kojundo Kagaku Kenkyusho Co.) were weighed so as to obtain the atomic ratio of bismuth, strontium, magnesium, barium, calcium, and copper as shown in the composition in Table 3. These were used as starting materials.

Thereafter, compositions for oxide superconductor were obtained in the same manner as in Example 1 except that lead was added in such as amount as giving the atomic ratio as shown in Table 3.

Each of the resulting compositions was press molded in a mold under a pressure of 147 MPa. Thereafter, Sample Nos. 1–3 were fired in the air for 80 hours at the firing temperature as shown in Table 3 and Sample Nos. 4–22 were fired in a low oxygen pressure atmosphere of $O_2:N_2=1:10$ in volume ratio for 80 hours at the firing temperature as shown in Table 3 to obtain oxide superconductors of 1 mm thick.

The resulting oxide superconductors were processed into rectangular parallelopipeds of the same size as in Example 1 and then, $T_c^{ZERO}$ was obtained in the same manner as in Example 1. The results are shown in Table 3.

Each of the oxide superconductors was ground in a mortar into powders and rate of change of inductance was measured and content of superconductor at 77 K was obtained. The results are shown in Table 3.

Separately, each of oxide superconductors of Sample Nos. 4, 5, 7, and 11 was again ground in a mortar and then press molded in a mold under a pressure of 196 MPa and subsequently, the resulting molded product was refired for 24 hours at the firing temperature as shown in Table 3 in the same low oxygen pressure atmosphere as used above to obtain again oxide superconductor. This was processed into a rectangular parallelopiped of the same size as in Example 1 and critical current density (Jc) was measured at the temperature of liquid nitrogen (77.3 K) by four terminal method. The results are shown in Table 4.

TABLE 3

| Sample No. | Composition | $T_c^{zero}$ (K) | Crystalline phase identified from X-ray diffraction peak | Firing temperature (°C.) | Superconductor content at 77K (vol %) |
|---|---|---|---|---|---|
| *1 | $BiSr_1Ca_1Cu_{1.5}Ox$ | 72 | Intermediate temperature phase, $Ca_2CuO_3$, high temperature phase | 875 | 0 |
| *2 | $Bi_1Sr_{0.9}Mg_{0.1}Ca_1Cu_{1.5}Ox$ | 70 | Intermediate temperature phase, CuO | 875 | 0 |
| *3 | $Bi_1Sr_{0.7}Mg_{0.3}Ca_1Cu_2Ox$ | 62 | Intermediate temperature phase, CuO, unidentifiable peak | 875 | 0 |
| *4 | $Bi_{0.8}Pb_{0.2}Sr_1Ca_1Cu_{1.8}Ox$ | 106 | High temperature, phase intermediate temperature phase | 845 | 63 |
| *5 | $Bi_{0.7}Pb_{0.3}Sr_1Ca_1Cu_{1.4}Ox$ | 105 | High temperature phase, intermediate temperature phase, $Ca_2PbO_4$ | 845 | 62 |
| *6 | $Bi_{0.9}Pb_{0.1}Sr_{0.8}Mg_{0.1}Ba_{0.1}Ca_1Cu_{1.8}Ox$ | 88 | High temperature phase, intermediate temperature phase | 835 | 52 |
| 7 | $Bi_{0.8}Pb_{0.2}Sr_{0.8}Mg_{0.1}Ba_{0.1}Ca_1Cu_{1.8}Ox$ | 110 | High temperature phase | 830 | 86 |
| 8 | $Bi_{0.8}Pb_{0.2}Sr_{0.8}Mg_{0.05}Ba_{0.15}Ca_1Cu_{1.8}Ox$ | 108 | High temperature phase | 830 | 83 |

TABLE 3-continued

| Sample No. | Composition | $T_c^{zero}$ (K) | Crystalline phase identified from X-ray diffraction peak | Firing temperature (°C) | Superconductor content at 77K (vol %) |
|---|---|---|---|---|---|
| *9 | $Bi_{0.8}Pb_{0.2}Sr_{0.6}Mg_{0.1}Ba_{0.3}Ca_1Cu_{1.8}Ox$ | 105 | High temperature phase, $BaCuO_2$, $BaBiO_3$ | 830 | 60 |
| *10 | $Bi_{0.8}Pb_{0.2}Sr_{0.55}Mg_{0.4}Ba_{0.05}Ca_1Cu_{1.8}Ox$ | 95 | High temperature phase, intermediate temperature phase, unidentifiable peak | 830 | 52 |
| 11 | $Bi_{0.7}Pb_{0.3}Sr_{0.85}Mg_{0.1}Ba_{0.05}Ca_1Cu_{1.8}Ox$ | 109 | High temperature phase | 830 | 82 |
| 12 | $Bi_{0.7}Pb_{0.3}Sr_{0.9}Mg_{0.05}Ba_{0.05}Ca_1Cu_{1.8}Ox$ | 109 | High temperature phase | 835 | 85 |
| *13 | $Bi_{0.7}Pb_{0.3}Sr_{0.7}Ba_{0.3}Ca_1Cu_{1.6}Ox$ | 103 | High temperature phase, $BaCuO_2$, $BaBiO_3$, Unidentifiable peak | 825 | 62 |
| 14 | $Bi_{0.7}Pb_{0.3}Sr_{0.7}Mg_{0.2}Ba_{0.1}Ca_1Cu_{1.6}Ox$ | 110 | High temperature phase | 825 | 89 |
| 15 | $Bi_{0.7}Pb_{0.3}Sr_{0.6}Mg_{0.3}Ba_{0.1}Ca_1Cu_{1.6}Ox$ | 107 | High temperature phase | 825 | 91 |
| 16 | $Bi_{0.8}Pb_{0.2}Sr_{0.9}Mg_{0.05}Ba_{0.05}Ca_1Cu_{1.8}Ox$ | 109 | High temperature phase | 835 | 84 |
| *17 | $Bi_{0.7}Pb_{0.3}Sr_{0.6}Mg_{0.35}Ba_{0.05}Ca_1Cu_{1.8}Ox$ | 90 | High temperature phase, Intermediate temperature phase, Unidentifiable peak | 825 | 59 |
| 18 | $Bi_{0.75}Pb_{0.25}Sr_{0.93}Mg_{0.05}Ba_{0.02}Ca_1Cu_{1.8}Ox$ | 108 | High temperature phase | 840 | 87 |
| *19 | $Bi_{0.75}Pb_{0.25}Sr_{0.75}Ba_{0.25}Ca_1Cu_{1.8}Ox$ | 106 | High temperature phase, $BaCuO_2$, $BaBiO_3$ | 830 | 61 |
| 20 | $Bi_{0.75}Pb_{0.25}Sr_{0.8}Mg_{0.15}Ba_{0.05}Ca_1Cu_{1.8}Ox$ | 110 | High temperature phase | 830 | 88 |
| *21 | $Bi_{0.6}Pb_{0.4}Sr_{0.8}Mg_{0.1}Ba_{0.1}Ca_1Cu_{1.8}Ox$ | 65 | Intermediate temperature phase, $Ca_2PbO_4$, unidentifiable peak | 830 | 53 |
| *22 | $Bi_{0.8}Pb_{0.2}Sr_1Ca_1Cu_2Ox$ | 106 | High temperature phase, intermediate temperature phase | 850 | 59 |

Mark * means samples which are not covered by the present invention. "Unidentifiable peak" shows that there exists indefinite crystalline phase.

TABLE 4

| | Sample No. | | | |
|---|---|---|---|---|
| | *4 | *5 | 7 | 11 |
| Jc (A/cm²) | 620 | 432 | 1840 | 1690 |

Mark * means samples which are not covered by the present invention.

The results shown in Table 3 and 4 show that in the oxide superconductors obtained in examples of the present invention, heterogeneous phases are not formed and they are higher in $T_c^{ZERO}$ and Jc than those of comparative examples and besides, in the superconductors of the present invention, much high temperature phase is formed and content of superconductor at 77 K is high.

EXAMPLE 3

Each of the oxide superconductors of Sample Nos. 4 and 18 obtained in Example 1 and Sample No. 7 obtained in Example 2 was ground in a mortar to obtain Samples A, B and C in the form of powder.

Samples A, B and C were subjected to powder X-ray diffraction and diffraction peak intensity ratio was obtained using the following formula:

$$\frac{\text{High temperature phase (0010)}}{\text{High temperature phase (0010)} + \text{Intermediate temperature phase (008)}}$$

Relation between diffraction peak intensity ratio and firing temperature is shown in FIG. 1.

Furthermore, rate of change of inductance of the above Samples A, B and C was measured and content of superconductor at 77 K was obtained. The results are shown in FIG. 2.

Figure 2:
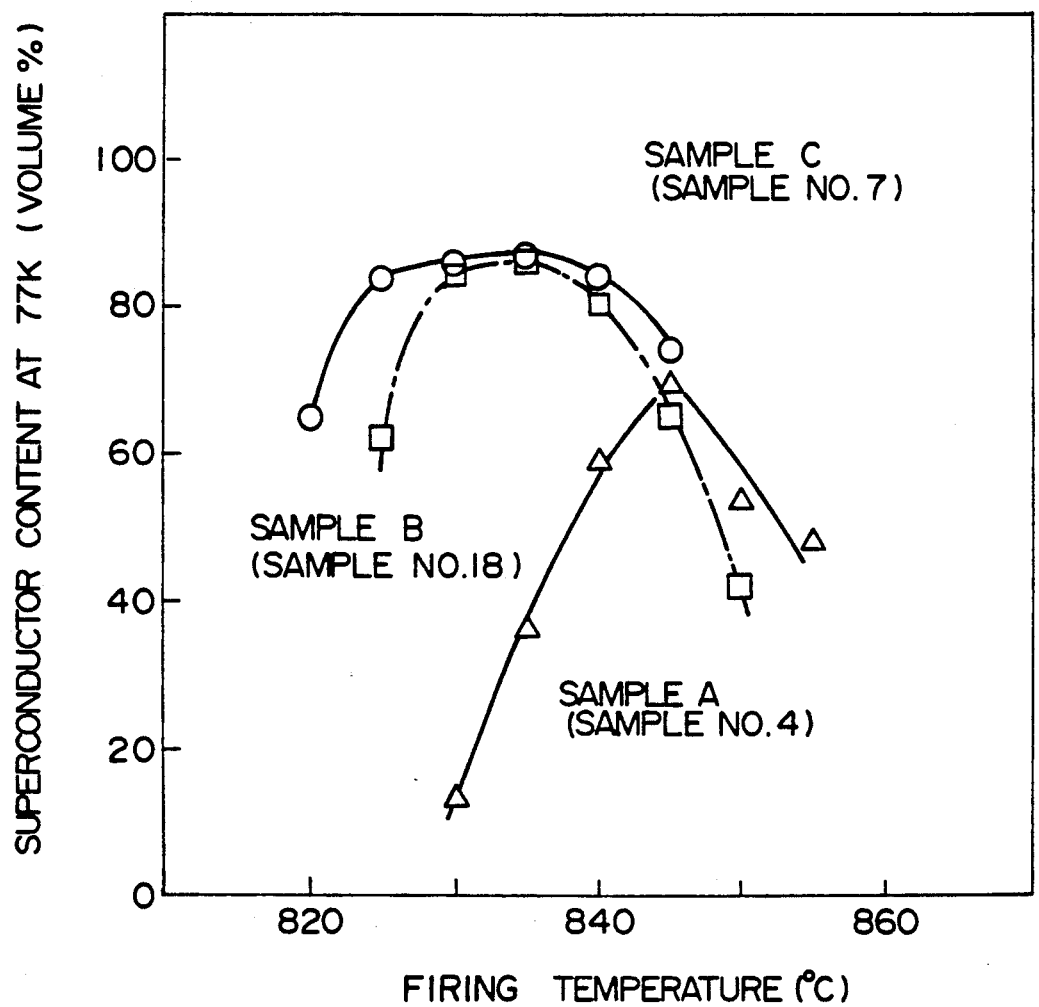

FIGS. 1 and 2 show that Samples B and C obtained using the oxide superconductors according to the examples of the present invention contain much high temperature phase and range of firing temperature for obtaining much high temperature phase is broad.

In the oxide superconductor of the present invention, high temperature phase is readily formed and range of firing temperature for forming much high temperature phase is broad, and substantially no heterogeneous phase is formed. Thus, this superconductor is high in $T_c^{ZERO}$ and Jc and is industrially very suitable.

What is claimed is:

1. An oxide superconductor which comprises bismuth, lead, strontium, calcium, magnesium, barium and copper and has the composition represented by the formula:

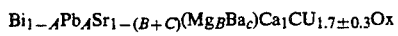
$Bi_{1-A}Pb_ASr_{1-(B+C)}(Mg_BBa_C)Ca_1Cu_{1.7\pm0.3}Ox$ wherein A=0.15–0.35, B=0.05–0.3, and C=0.02–0.2 and x is the amount of oxygen depending on the amount of Pb and the amount and oxidation state of Cu, in which numerals represent atomic ratio.

2. A method for producing an oxide superconductor which comprises weighing starting materials containing bismuth, lead, strontium, calcium, magnesium, barium and copper, respectively, in appropriate atomic ratios so as to obtain the composition represented by the formula:

$Bi_{1-A}Pb_ASr_{1-(B+C)}(Mg_BBa_C)Ca_1Cu_{1.7+0.3}Ox$ wherein A=0.15–0.35, B=0.05–0.3, and C=0.02–0.2 and x is the amount of oxygen depending on the amount of Pb and the amount and oxidation state of Cu, then primarily mixing the starting materials containing bismuth, strontium, calcium, magnesium, barium and copper, respectively, calcining and grinding the mixture, adding a starting material containing lead to the ground product, secondarily mixing the starting material containing lead and the ground product and firing the resulting mixture.

3. A method according to claim 2, wherein the starting materials containing bismuth, lead, strontium, calcium, magnesium, barium and copper are weighed in atomic ratio of 1−A: A:1−(B+C):B:C:1:1.7±0.3, wherein A=0.15–0.35, B=0.05–0.3, and C=0.02–0.2.

4. An oxide superconductor which comprises bismuth, lead, strontium, magnesium, barium, calcium and copper and has the composition represented by the formula:

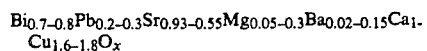
$Bi_{0.7-0.8}Pb_{0.2-0.3}Sr_{0.93-0.55}Mg_{0.05-0.3}Ba_{0.02-0.15}Ca_1Cu_{1.6-1.8}Ox$ where x is the amount of oxygen depending on the amount of Pb and the amount and oxidation state of Cu.

* * * * *